United States Patent
Hong

(10) Patent No.: US 11,342,448 B2
(45) Date of Patent: May 24, 2022

(54) METHOD FOR MANUFACTURING SEMICONDUCTOR DEVICE

(71) Applicant: Ying Hong, Liaoning (CN)

(72) Inventor: Ying Hong, Liaoning (CN)

( * ) Notice: Subject to any disclaimer, the term of this patent is extended or adjusted under 35 U.S.C. 154(b) by 0 days.

(21) Appl. No.: 17/028,337

(22) Filed: Sep. 22, 2020

(65) Prior Publication Data

US 2021/0005736 A1   Jan. 7, 2021

Related U.S. Application Data

(63) Continuation of application No. PCT/KR2019/002508, filed on Mar. 5, 2019.

(30) Foreign Application Priority Data

Mar. 23, 2018 (KR) .......... 10-2018-0034096
Oct. 15, 2018 (KR) .......... 10-2018-0122770

(51) Int. Cl.
*H01L 29/66* (2006.01)
*H01L 21/02* (2006.01)
*H01L 29/08* (2006.01)

(52) U.S. Cl.
CPC .. *H01L 29/66757* (2013.01); *H01L 21/02672* (2013.01); *H01L 29/0847* (2013.01); *H01L 29/66772* (2013.01)

(58) Field of Classification Search
CPC ......... H01L 21/02458; H01L 21/02488; H01L 21/02502; H01L 27/1222; H01L 27/1281;
(Continued)

(56) References Cited

U.S. PATENT DOCUMENTS

2003/0183875 A1* 10/2003 Isobe ............... H01L 21/02425
257/347
2004/0248346 A1* 12/2004 Rusian ............... H01L 21/0243
438/166

FOREIGN PATENT DOCUMENTS

JP      2005-294628     10/2005
JP       3942100         7/2007
(Continued)

OTHER PUBLICATIONS

Machine Translation of JP 2012-004411 (Year: 2012).*
International Search Report for International Application PCT/KR2019/002508, dated Jun. 13, 2019.

*Primary Examiner* — Julia Slutsker
(74) *Attorney, Agent, or Firm* — Burns Law, PLLC

(57) ABSTRACT

Provided is a method of manufacturing a semiconductor device, the method including: forming an insulating layer on a substrate; forming a trench, which extends in a first direction parallel with the plane of the substrate, to a preset depth in the insulating layer in a second direction perpendicular to the plane of the substrate; forming a plurality of amorphous silicon strips, which extend from the inside of the trench in the second direction intersecting with the first direction, in parallel in a first direction; forming a spacer on a side of the amorphous silicon strip by using an insulating material layer; and crystallizing the amorphous silicon strip by heat treatment, wherein crystal nucleation sites are formed in the amorphous silicon layer in the trench, and a polycrystalline silicon layer is formed by lateral grain growth in a longitudinal direction of the amorphous silicon strip from the crystal nucleation site.

12 Claims, 9 Drawing Sheets

(58) Field of Classification Search
CPC ........... H01L 29/42384; H01L 29/4236; H01L 21/0274

See application file for complete search history.

(56) References Cited

FOREIGN PATENT DOCUMENTS

| | | |
|---|---|---|
| JP | 4397599 | 1/2010 |
| JP | 2012-004411 | 1/2012 |
| KR | 10-1997-0024232 | 5/1997 |
| KR | 10-0611659 | 8/2006 |
| KR | 10-2016-0135077 | 11/2016 |

\* cited by examiner

METHOD FOR MANUFACTURING SEMICONDUCTOR DEVICE

CROSS-REFERENCE TO RELATED APPLICATIONS AND PRIORITY

The present application is a continuation of International Application No. PCT/KR2019/002508, filed on Mar. 5, 2019, which claims priority to and the benefit of the filing dates of Korean Patent Application Nos. 10-2018-0034096, filed on Mar. 23, 2018, and 10-2018-0122770, filed on Oct. 15, 2018, in the Korean Intellectual Property Office, the disclosures of which are incorporated herein in their entirety by reference.

TECHNICAL FIELD

The present disclosure relates to a semiconductor device, and more particularly, to an LTPS semiconductor device.

BACKGROUND

AM-OLED displays have been mainly applied to mobile devices such as recent smartphones. As a pixel switching element of such an AM-OLED display, a low temperature polycrystalline silicon thin film transistor (LTPS TFT) having high mobility and high reliability is appropriate.

Excimer laser annealing is mainly applied for crystallizing of silicon to manufacture a low temperature polycrystalline silicon thin film transistor (LTPS TFT). Such an LTPS TFT has high mobility and high reliability as described above but may not maintain crystal grain uniformity of a certain level when being applied to a large area display. Therefore, there is a limit to increasing yield when a large area display is manufactured by applying an LTPS TFT.

SUMMARY

Provided is related to a method of manufacturing a semiconductor device capable of crystal grain uniformity of a semiconductor layer.

Provided is also related to a method of manufacturing a polycrystalline silicon semiconductor device appropriate for a large area device.

According to an aspect of the present disclosure, a method of manufacturing a semiconductor device, may include:
forming an insulating layer on a substrate;
forming a trench to a preset depth in the insulating layer on the substrate;
forming a plurality of amorphous silicon strips, which extend from the inside of the trench to intersect with the trench, in parallel in a longitudinal direction of the trench;
forming spacers on sides of each of the amorphous silicon strips to protect edges of the amorphous silicon strips; and
crystallizing the amorphous silicon strips by heat treatment to form polycrystalline silicon strips, wherein a crystal nucleation site is formed in each of the amorphous silicon layers in the trench, and then lateral grain growth is induced from each of the crystal nucleation sites in a longitudinal direction of each of the amorphous silicon strips.

Excimer laser annealing may be applied as the heat treatment and completely melt amorphous silicon up to a portion of the amorphous silicon inside the trench.

The method may further include forming a capping layer covering the amorphous silicon layer before the heat treatment.

The silicon strip and the trench may extend in a direction orthogonal to each other.

The forming the trench may include forming an insulating layer having a trench of a preset width on the substrate; and depositing a cover layer to a preset thickness on the insulating layer to reduce the width of the trench.

The forming the silicon strip may include: forming an amorphous silicon layer to a preset thickness on the insulating layer and on inner wall and bottom of the trench;
obtaining a plurality of parallel silicon strips by patterning the amorphous silicon layer;
forming an insulating material layer on the insulating layer and in the trench where the silicon strip is formed; and
removing a portion of the insulating material layer on the amorphous silicon layer by etch back, wherein a portion of the insulating material layer remains at both edges of the silicon strip and on an inner wall of the trench to form a spacer protecting both edges of the silicon strip and a portion of the amorphous silicon layer on the inner wall of the trench.

The method may further include forming a spacer of an insulating material on both edges of the silicon layer in the second direction.

The forming the space may include: forming an insulating material layer to a preset thickness on the entire surface of the amorphous silicon strip; and obtaining a spacer by an insulating material remaining on side edges of the silicon strip by etching back a preset thickness of the insulating material layer.

The space may be formed of one selected from $SiO_2$, SiNx, SiONx, AlOx, and HfOx.

The method may further include, after the crystallizing the silicon strip, patterning a channel, forming a gate insulating layer, forming a gate, doping source drain for a silicon layer on both sides of the gate, and activating the source/drain.

The method may further include electrically insulating a silicon layer in the trench from a silicon layer on the insulating layer.

An AlN layer may be formed on the bottom of the trench.

According to an example embodiment of the present disclosure, in a process of manufacturing a plurality of semiconductor devices on a substrate, a plurality of crystal generation sites are arranged in a line, and a crystallization direction of a plurality of amorphous silicon strips is artificially adjusted, thereby forming a single crystal-grained silicon channel. The semiconductor devices such as TFTs have the single crystal-grained silicon channel that is grown in the artificially adjusted direction, and thus, a difference in device-to-device characteristics is reduced, thereby improving characteristic uniformity of the semiconductor devices and increasing product yield. A method of manufacturing a semiconductor device according to the example embodiment as described above may add a process such as trench formation to an existing process such as ELA without needing new equipment. The example embodiment may be applied to manufacture a large area AM-OLED as well as to manufacture an existing AM-OLED for a smartphone.

DETAILED DESCRIPTION

Figure 1A:
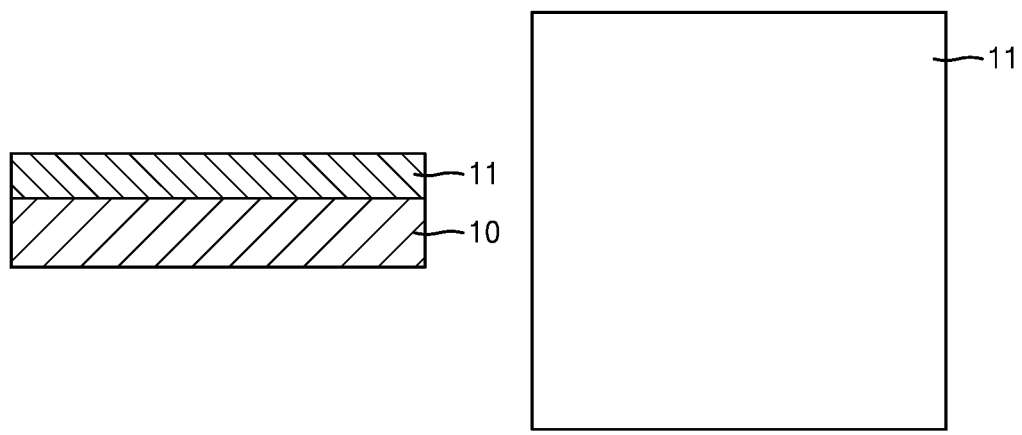
FIG. 1A show a process for forming an insulating layer, according to an example embodiment.

Hereinafter, example embodiments of the present disclosure will be described in detail with reference to the accompanying drawings. However, embodiments of the present disclosure may be modified into various forms, and the scope of the present disclosure should not be construed as being limited by the embodiments described below. The embodiments of the present disclosure may be interpreted as being provided to further completely explain the spirit of the present disclosure to one of ordinary skill in the art. Like reference numerals in the drawings denote like elements. Various elements and areas in the drawings are schematically drawn. Therefore, the spirit of the present disclosure is not limited by the relative size or spacing drawn in the accompanying drawings.

Although the terms first, second etc. may be used herein to describe various elements, these elements should not be limited by these terms. These terms are only used to distinguish one element from another element. For example, a first element may be termed a second element and conversely, the second element may be termed the first element without departing from the scope of the present disclosure.

The terminology used herein is for the purpose of describing particular embodiments only and is not intended to be limiting of example embodiments. As used herein, the singular forms are intended to include the plural forms as well, unless the context clearly indicates otherwise. It will be further understood that the terms "comprises" and/or "have" when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meanings as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When a certain embodiment may be implemented differently, a specific process order may be performed differently from the described order. For example, two processes described in succession may be performed substantially simultaneously or may be performed in an order opposite to the described order.

As such, variations from the shapes of the illustrations as a result, for example, of manufacturing techniques and/or tolerances, are to be expected. Thus, example embodiments should not be construed as limited to the particular shapes of regions illustrated herein but may be to include deviations in shapes that result, for example, from manufacturing. As used herein, the term "and/or" includes any and all combinations of one or more of the associated listed items. The term "substrate" as used herein may mean a substrate itself or a stacked structure including a substrate and a predetermined layer or film formed on the surface thereof. As used herein, "the surface of the substrate" may mean an exposed surface of the substrate itself, or an outer surface of a predetermined layer or film formed on the substrate. What is described as "above" or "on" may include not only those directly on in contact but also non-contact above.

A method of manufacturing a semiconductor device according to an example embodiment has the following characteristics. Amorphous silicon filled in a trench extending in one direction is melted in an ELA process and then first cooled to artificially arrange initial nucleation sites in a line, and crystal growth thereof proceeds from the bottom of the trench to the top. Amorphous silicon which is prepatterned side by side in the form of a plurality of narrow strips along a trench in one direction is also melted in an ELA process and is grown as single crystal grain silicon laterally along a seed which is first crystallized in the trench. In such a growth process, crystal grain is filtered by a silicon layer which is prepatterned as a band-to-strip type, and thus, the silicon layer has single crystal grain silicon.

Hereinafter, a method of manufacturing a single crystal grain semiconductor device will be described in detail.

FIGS. 1A through 1H show a process of forming a polycrystalline silicon channel to be applied to a semiconductor device. Left drawings of FIGS. 1A through 1H are cross-sectional views, and right drawings of FIGS. 1A through 1H are plan views of corresponding portions.

As shown in FIG. 1A, an insulating layer 11 is formed on a substrate 10. A material of the substrate 10 is not limited to a particular material, and glass, plastic, or the like may be selected. The insulating layer 11 may be formed of $SiO_2$ to a thickness of about 1 μm. However, according to another embodiment, the insulating layer 11 may have a structure of a single layer formed of one of $SiO_2$, SiNx, and SiNOx or a multilayer formed of the same or different materials.

Here, according to another embodiment, before the insulating layer 11 is formed on the substrate 10, AlN may be deposited. Aluminum nitride has a function as a seed layer during crystal growth. Before an amorphous silicon layer is deposited, the AlN is exposed at the bottom of a trench 11a vertically below a substrate plane that will be described later, and the exposed AlN contributes to the growth of polycrystalline silicon later.

Figure 1B:
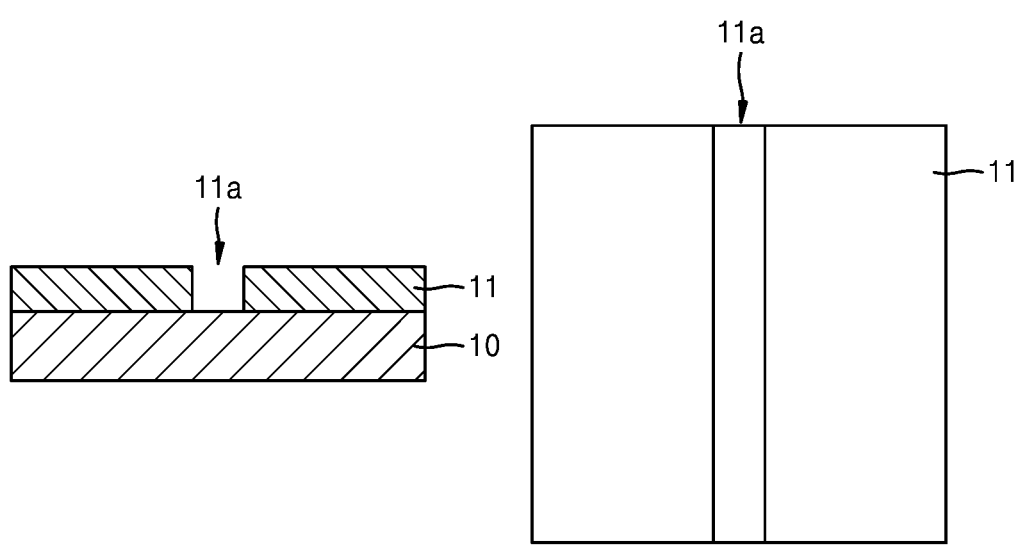
FIG. 1B illustrates a process for forming a trench in the insulating layer, according to an example embodiment.

As shown in FIG. 1B, the trench 11a that extends in a random first direction is formed in a preset width in the insulating layer 11. When a vertical width of the trench 11a to be targeted is not obtained due to the limitation of a patterning method the method may proceed to a next stage shown in FIG. 1C to further narrow the width of the trench 11a obtained at the current stage. When not, the method may skip to a next stage shown in FIG. 1D. In the present embodiment, the next stage shown in FIG. 1C is performed, and the width of the trench 11a is determined, for example as 1.5 μm at the current stage.

Figure 1C:
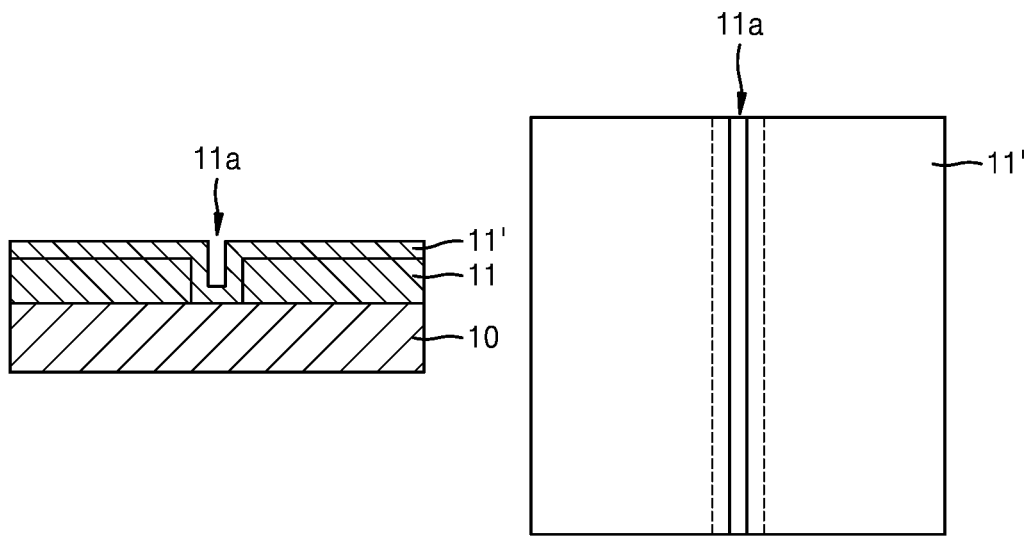
FIG. 1C illustrates a process for narrowing the trench, according to an example embodiment.

As shown in FIG. 1C, a cover layer 11' is formed on the insulating layer 11. This stage is a selective stage for further narrowing the width of the vertical trench 11a as described above. To narrow the width of the trench 11a, the cover layer 11' having a thickness of, for example, 700 nm is formed on the insulating layer 11. The cover layer 11' is an element of the insulating layer 11 and extends to the inside of the trench 11a. Therefore, the width of the trench 11a is reduced by the thickness of the cover layer 11', for example, reduced from about 1.5 μm to about 100 nm.

Figure 1D:
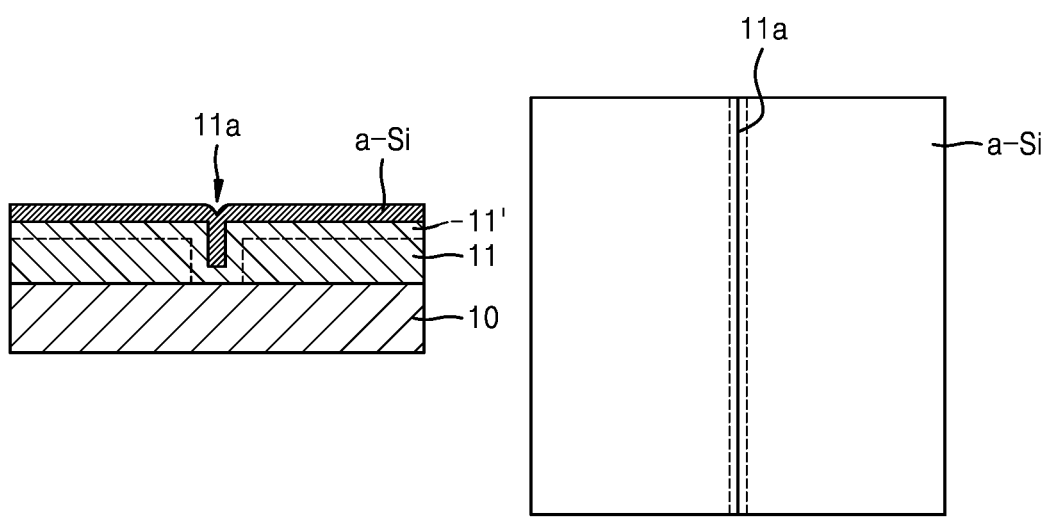
FIG. 1D illustrates a process for forming an amorphous layer on the insulating layer, according to an example embodiment.

As shown in FIG. 1D, an amorphous silicon layer a-Si is deposited on the entire surface of the insulating layer 11 or the cover layer 11' of the substrate 10 to a preset thickness, for example, of about 50 nm to about 100 nm. According to this deposition, the inside of the trench 11a is filled with the amorphous silicon layer a-Si.

Figure 1E:
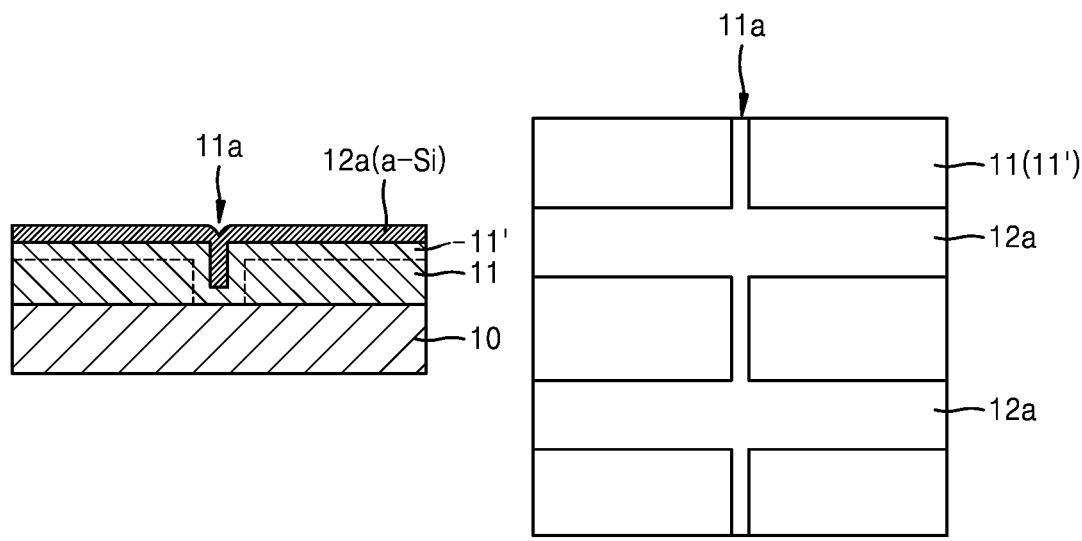
FIG. 1E illustrates a process for forming strips by patterning the amorphous layer, according to an example embodiment.

As shown in FIG. 1E, a plurality of narrow and long strips 12a are formed in parallel by patterning the amorphous silicon layer a-Si. The plurality of silicon strips 12a extend in a second direction different from a first direction which is an extension direction of the trench 11a, in particular, in a second direction orthogonal to the first direction in the present embodiment. Also, the silicon strips 12a are arranged side by side at regular intervals from each other. The arrangement of the silicon strips 12a is related to an arrangement location of a semiconductor device which is a manufacturing target. For example, each of the silicon strips 12a corresponds to a location of a switching element (a TFT and a driver TFT) for each pixel of a display device. As a whole, the amorphous silicon in the trench 11a is connected to one of the silicon strips 12a orthogonal thereto.

Figure 1F:
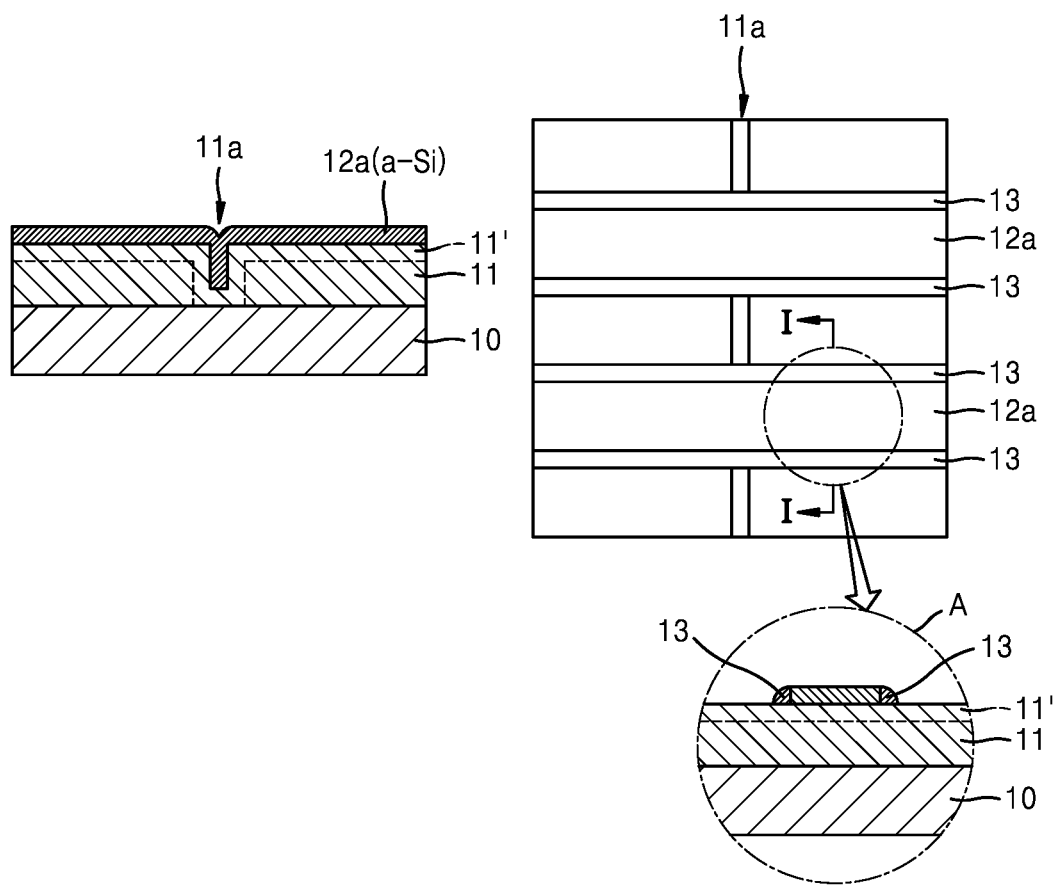
FIG. 1F illustrates a process for forming spacers on both edges of the strips, according to an example embodiment.

As shown in FIG. 1F, a spacer 13 is formed of an insulating material having a higher melting point than the silicon strip 12a, for example, $SiO_2$, on both edges of the silicon strip 12a. According to an example embodiment, the spacer 13 may be obtained through formation of an insulating layer by entire surface deposition of an insulating material and an etch back process for the insulating material layer. For example, $SiO_2$ may be deposited to a thickness of 150 nm on the entire upper surface of the substrate 10 on which the silicon strip 12a is formed, and the thickness of 150 nm is entirely etched through etch back, thereby obtaining the spacer 13 by residues unetched on both sides of the silicon strip 12a. The process of forming the spacer 13 is selective in the present semiconductor manufacturing process. However, the current stage may be performed to prevent breakage of the silicon strip 12a which is melted due to high energy in a crystal growth process at a stage that will be described later. Portion A in FIG. 1F is a cross-sectional view taken along line I-I of FIG. 1F.

Figure 1G:
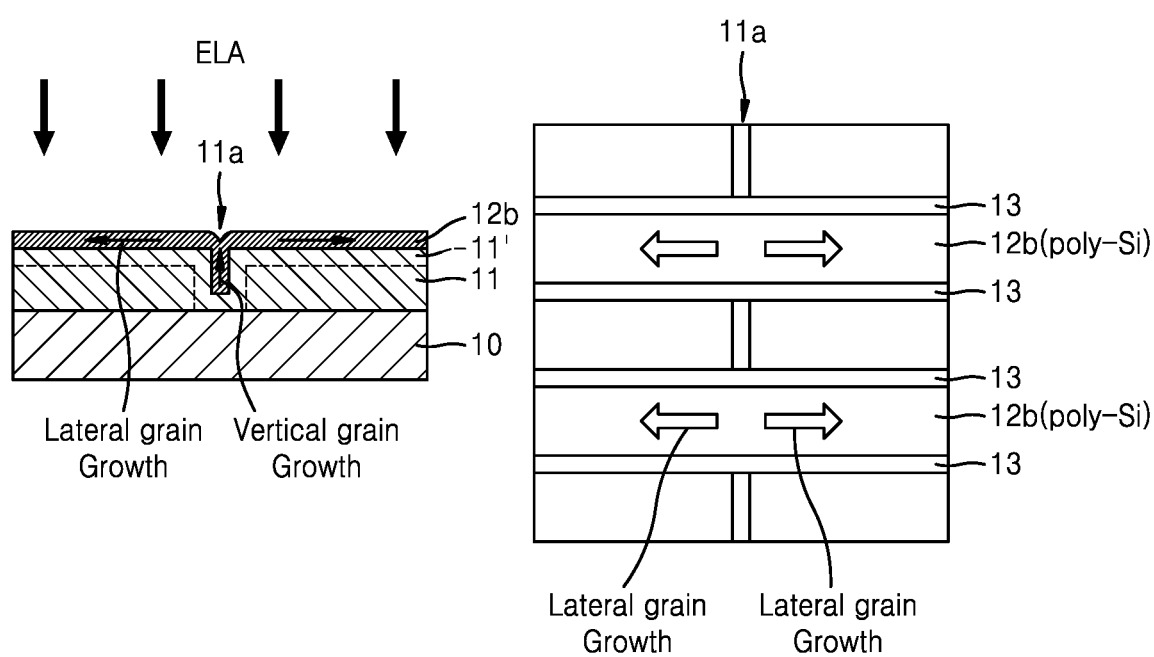
FIG. 1G illustrates a process for crystallization of the strips, according to an example embodiment.

As shown in FIG. 1G, crystallization of the silicon strip 12a is performed through a heating-melting-cooling process for the silicon strip 12a. The breakage of the silicon strip 12a may occur when the silicon strip 12a (amorphous silicon) is melted by high energy, in particular, may occur in a portion close to the trench 11a where heat is concentrated. Here, the spacer 13 surrounding the entire silicon strip 12a in the form of a dam on both sides of the silicon strip 12a confines the melted amorphous silicon therein to prevent the flow in the lateral direction and absorbs heat from the edge of the silicon strip 12a to prevent the breakage of the silicon strip 12a.

In this state, the melted amorphous silicon is cooled and crystallized, crystal nuclei are generated in silicon inside the trench 11a which has the fastest cooling rate, and grain growth proceeds therefrom. In this crystallization process, the silicon strip 12a made of the amorphous silicon is changed into a polycrystalline silicon layer 12b made of single crystal-grained silicon having one grain boundary. At an initial stage of crystal grain growth, vertical crystal grain growth proceeds inside the trench 11a, and then lateral grain growth proceeds from the top of the trench 11a. Before heat treatment for crystallization as described above, when a capping layer is additionally formed of $SiO_2$ or the like on the entire surface of a stack structure in which the silicon strip 12a is formed, a silicon layer in which the capping layer may thermally protect the melted silicon layer, thereby suppressing heat loss and increasing a heat treatment effect.

ELA may be applied as a heat treatment method, and, when the silicon strip 12a is thermally treated by ELA, amorphous silicon inside the trench 11a may be completely melted.

Before performing heat treatment by ELA or the like as described above, pretreatment such as a dehydrogenation process needs to be performed not to produce elements that may release gases such as hydrogen in a stack structure. Also, while ELA is performed, the ELA may be performed at single shot, two shots, or multi-shots. Here, when the width of the silicon strip 12a is maintained less than or equal to a certain value, a plurality of crystal grains are produced in a crystal growth process that is performed in a longitudinal direction of a silicon strip of a narrow width. Competition occurs between the plurality of crystal grains for a duration of this growth process. Through this process, one crystal grain survives, and remaining crystal grains are absorbed into the one crystal grain, thereby obtaining a silicon strip 12b by the one crystal grain.

When AlN is exposed at the inner bottom of the trench 11a and contacts amorphous silicon, as described above, the AlN function as a seed layer at an initial stage of crystallization. As needed, AlN may be oxidized and surface treated with gamma $Al_2O_3$. In this case, when ELA is performed, orientation of vertical silicon growth is controlled, and thus, orientation of silicon is also controlled during lateral growth. Also, AlN has high heat conductivity and thus assists in increasing the grain size during lateral crystal grain growth.

FIGS. 2A through 2E are cross-sectional views sequentially showing processes of forming a polycrystalline silicon channel, according to another embodiment.

In the above-described embodiment, a cover layer is applied to reduce a width of a trench that provides crystal nucleation sites. In the present embodiment, a process order is slightly changed to form a vertical silicon layer of a fine line width in which crystal nucleation sites are formed by a narrow trench without the cover layer aforementioned.

Figure 2A:
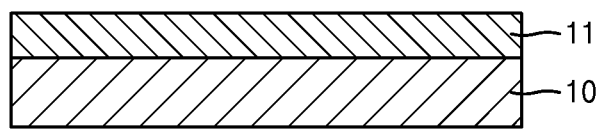
FIG. 2A shows a process for forming an insulating layer on a substrate according to another example embodiment.

As shown in FIG. 2A, an insulating layer 11 is formed of SiO$_2$ or the like on a substrate 10.

Figure 2B:
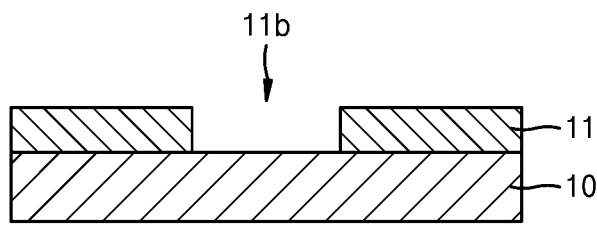
FIG. 2B shows a process for forming a trench in the insulating layer, according to another example embodiment.

As shown in FIG. 2B, a trench 11*b* that extends a first direction is formed in the insulating layer 11. Here, the trench 11*b* may have greater width than a trench in the above-described embodiment.

Figure 2C:
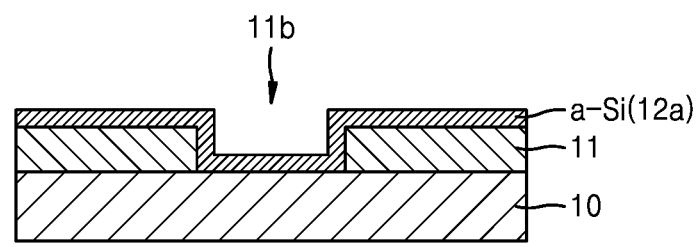
FIG. 2C shows a process for forming a thin amorphous silicon layer on the insulating layer, according to another example embodiment.

As shown in FIG. 2C, a thin amorphous silicon layer a-Si is formed on the insulating layer 11. Here, a thickness of the amorphous silicon layer a-Si may have a value corresponding to a thickness of a polycrystalline silicon channel that will be obtained later, for example, a value of 50 nm. Therefore, the amorphous silicon layer a-Si is formed on the insulating layer 11 and on an inner wall and bottom of the trench 11*b*. Accordingly, the width of the trench 11*b* is slightly reduced by the amorphous silicon a-Si formed on the inner wall thereof. As described above, a plurality of amorphous silicon strips 12*a* that extend in a second direction different from the first direction are formed on the insulating layer 11 outside the trench 11*b* by patterning the amorphous silicon layer a-Si.

Figure 2D:
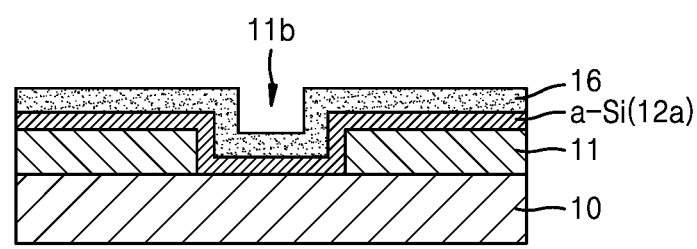
FIG. 2D shows a process for forming an insulating material layer on a substrate, according to another example embodiment.

As shown in FIG. 2D, an insulating material layer 16 is formed above the substrate 10 on which the silicon strip 12*a* is formed. The insulating material layer 16 may be formed of a heat-resistant insulating layer such as SiO$_2$.

Figure 2E:
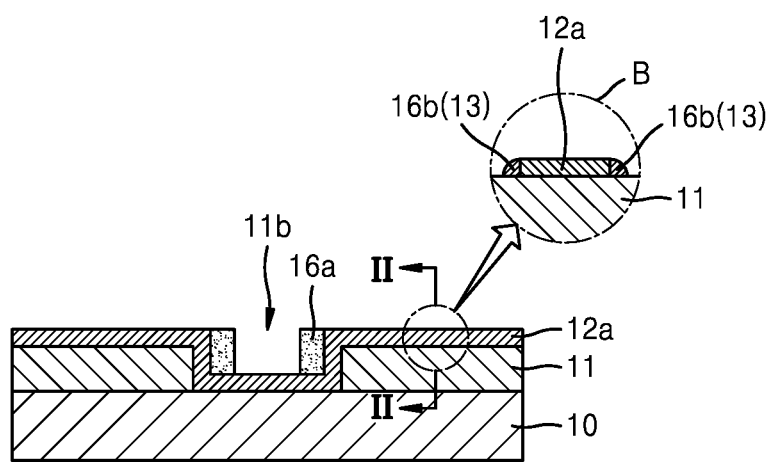
FIG. 2E shows a process for etching back the insulating material layer, according to another example embodiment.

As shown in FIG. 2E, the insulating material layer 16 is etched back by an etching process to expose a surface of the silicon strip 12*a*, covered with the insulating material layer 16, outside the trench 11*b*. In FIG. 2E, portion B is a cross-sectional view taken along line II-II. According to such etch back, an insulating material of a portion perpendicular to an incidence direction of etchant, the insulating material remain on the vertical inner wall of the trench 11*b* and at both edges of the silicon strip 12*a*, thereby forming a space 16*a* at a trench portion and a spacer 16*b*, 13 at both edge portions of the silicon strip 12*a*. The spacers 16*a* and 16*b* prevent breakage of the silicon strip 12*a* when vertical amorphous silicon inside the trench 11*b* and the silicon strip 12*a* connected thereto are melted during heat treatment.

This state may correspond to the state of FIG. 1E before heat treatment in the above-described embodiment. Therefore, after the process of FIG. 2E is completed, a process of crystallizing amorphous silicon as in the description of FIG. 1G is performed to manufacture a semiconductor device to be targeted.

Through the above process, a single crystal grain TFT may be obtained by using a polycrystalline silicon strip, and a multichannel TFT may be manufactured by applying a plurality of parallel silicon strips to one device. In the case of the multichannel TFT, orientation directions of single crystal grains of each channel are random, but statistically, variation in device-to-device characteristics is reduced.

After a single crystal-grained silicon strip is obtained through the above process, various types of semiconductor devices may be manufactured through a subsequent process. When a TFT is manufactured, processes, such as formation of a gate insulating layer and a gate, doping and activation of source and drain, formation of a passivation layer, and formation of source and drain electrodes, may be performed through a general process.

Figure 3:
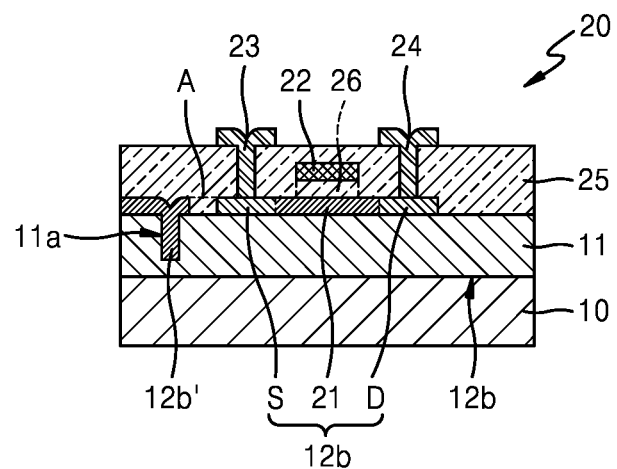
FIG. 3 is a schematic cross-sectional view of a single channel TFT which uses, as a semiconductor channel, a single crystal grain silicon strip obtained according to an example embodiment.

FIG. 3 is a schematic cross-sectional view of a single channel TFT using, as a semiconductor channel, a single crystal grain silicon strip obtained through the process as described above.

Referring to FIG. 3, an insulating layer 11 is formed on a substrate 10, a single crystal grain silicon strip 12*b* obtained thereon through the above-described process is patterned and applied as a channel 21. A source region S and a drain region D by doping are provided on both sides of the channel 21, and a gate insulating layer 26 and a gate 22 are sequentially provided above the channel 21. The gate 22 is covered with a passivation layer 25, and a source electrode 23 and a drain electrode 24 that are connected to the source region S and the drain region D are formed in the passivation layer 25. In this structure, the source region S and the drain region D and the source electrode 23 and the drain electrode 24 corresponding thereto may change locations thereof with each other.

The channel 21 is obtained by patterning the silicon strip 12*b* to an appropriate length. The channel 21 isolated from a vertical single crystal grain silicon strip 12*b*' of the trench 11*a* by an isolation region A. This is to protect a TFT from parasitic capacitance occurring by vertical single crystal-grained silicon.

Figure 4:
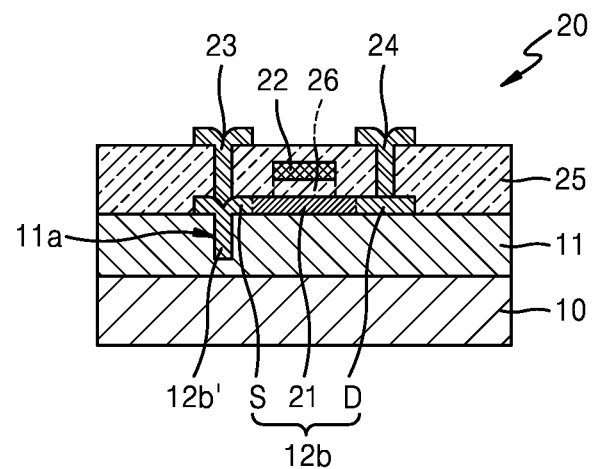
FIG. 4 is a schematic cross-sectional view of a single channel TFT which uses, as a semiconductor channel, a single crystal grain silicon strip obtained according to another example embodiment.

According to another embodiment, as shown in FIG. 4, a source electrode 23 and a drain electrode 24 are formed in a passivation layer 25. The source electrode 23 is located directly above a trench 11*a* and is connected to vertical single crystal grain silicon 12*b*' of the trench 11*a*. The vertical single crystal grain silicon 12*b*' in the trench 11*a* is a conductive region by doping and activation.

Figure 5A:
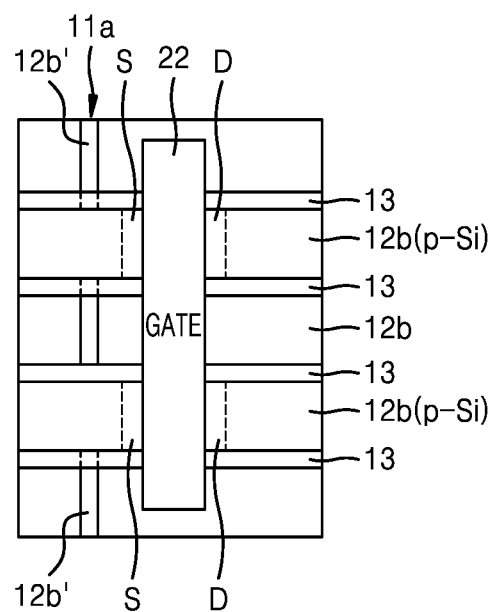
FIG. 5A is a plan view symbolically showing an arrangement structure of a multichannel and a gate in a multichannel TFT.
Figure 5B:
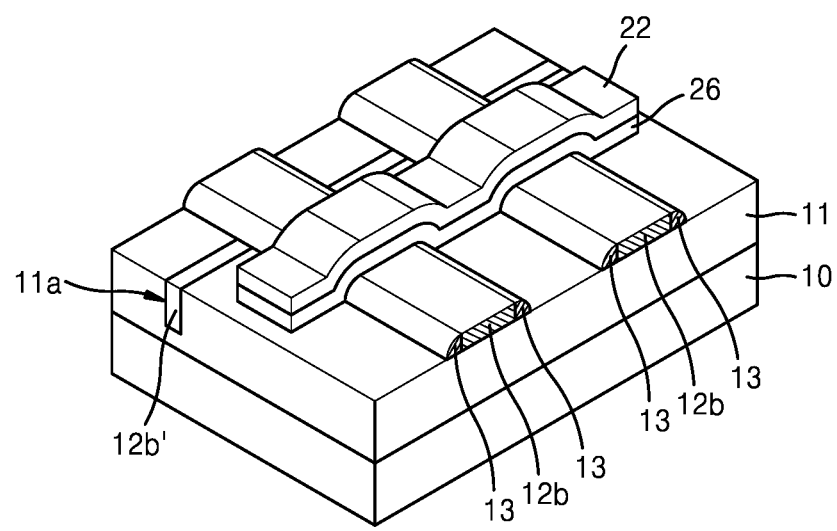
FIG. 5B is a three-dimension view symbolically showing an arrangement structure of a multichannel and a gate in a multichannel TFT.

FIGS. 5A and 5B are a plan view and a three-dimensional view schematically showing an arrangement structure of a multichannel and a gate of a multichannel TFT.

Referring to FIGS. 5A and 5B, according to the above-described example embodiment, an insulating layer 11 is formed on a substrate 10, and a plurality of channels controlled by one gate 22 are provided thereon, and in the present embodiment, two channels are provided. The two channels are provided by two parallel polycrystalline silicon layers 12*b*, and a source area S and a drain area D are provided on both sides of the channel that are not covered with the gate 22. A spacer 13 as described above is formed at longitudinal edges of both sides of the two polycrystalline silicon layers 12*b*. The two polycrystalline silicon layers 12*b* may be physically connected to polycrystalline silicon 12*b*' of a trench 11*a* and may be isolated from silicon of a TFT area in a subsequent process.

According to the present invention, a plurality of parallel polycrystalline silicon layers may be crystallized and grown laterally by crystal nucleation sites formed in an extending vertical trench and may be applied not only to manufacture a TFT, CMOS, and the like but also to manufacture PIN and the like. When the polycrystalline silicon layer is manufactured in the form of a finely fine nanowire, the polycrystalline silicon layer may be applied to manufacture a biosensor, an optical sensor, a meta optical device, and the like. Also, polycrystalline silicon formed in a trench may be used to manufacture a vertical TFT and may be used for memory or a diode device.

A method of manufacturing a semiconductor device according to an example embodiment has been described with reference to the embodiments shown in the drawings to aid in understanding the present disclosure, but this is merely an example. It will be understood by one of ordinary skill in the art that various modifications and other equivalent embodiments are possible therefrom. Therefore, the technical scope of the present disclosure should be defined by the appended claims.

What is claimed is:

1. A method of manufacturing a semiconductor device, the method comprising:

forming an insulating layer on a substrate;

forming a trench to a preset depth in the insulating layer on the substrate;

forming a plurality of amorphous silicon strips, which extend from an inside of the trench to intersect with the trench, in parallel in a longitudinal direction of the trench;

forming spacers in the form of a dam on both sides of each of the amorphous silicon strips to prevent breakage of the amorphous silicon strips during a following heat treatment for melting the amorphous silicon strips;

melting the amorphous silicon strips by the heat treatment; and cooling the amorphous silicon strips to form single crystal grain silicon strips, wherein a crystal nucleation site is formed in each of the amorphous silicon strips in a bottom of the trench, vertical grain growth in a first direction is induced from each of the crystal nucleation site, and then lateral grain growth in a second direction different from the first direction is induced from a top of the trench in a longitudinal direction of each of the amorphous silicon strips.

2. The method of claim 1, further comprising:
forming a capping layer covering the amorphous silicon strips before the heat treatment.

3. The method of claim 1, wherein forming the spacers on the both sides of each of the amorphous silicon strips further comprises:
forming an insulating material layer on an entire surface of the substrate on which the amorphous silicon strip is formed; and
removing the insulating material layer partially by etch back, wherein the insulating material layer on the both sides of each of the amorphous silicon strips remains as the spacers.

4. The method of claim 1, further comprising:
before forming the amorphous silicon strips, forming an AlN layer on the bottom of the trench.

5. The method of claim 4, further comprising:
reducing a width of the trench formed in the insulating layer by forming a cover layer on the insulating layer.

6. The method of claim 1, further comprising:
forming an amorphous silicon layer in inner surface of the trench and on the insulating layer;
forming a plurality of parallel silicon strips on the insulating layer by patterning the amorphous silicon layer;
forming an insulating material layer on inner surface of the trench and on the plurality of parallel silicon strips; and
removing a portion of the insulating material layer by an etch back process, wherein a portion of the insulating material layer remains at both edges of each of the plurality of parallel silicon strips and on a vertical inner wall of the trench to form the spacers.

7. The method of claim 5, further comprising:
forming a channel by patterning the single crystal grain silicon strips;
forming a gate insulating layer and a gate above the channel;
forming a source region and a drain region by doping both sides of the channel;
forming a passivation layer covering the gate; and
forming, on the passivation layer, a source electrode and a drain electrode electrically connected to the source region and the drain region provided on both sides of the channel.

8. The method of claim 7, wherein the source region or the drain region is formed on the trench.

9. The method of claim 7, further comprising:
isolating a part of the single crystal grain silicon strips located over the trench from the channel.

10. The method of claim 6, further comprising:
forming a channel by patterning the single crystal grain silicon strips;
forming a gate insulating layer and a gate above the channel;
forming a source region and a drain region by doping the both sides of the channel;
forming a passivation layer covering the gate; and
forming, on the passivation layer, a source electrode and a drain electrode electrically connected to the source region and the drain region provided on both sides of the channel.

11. The method of claim 10, wherein the source region or drain region is formed on the trench.

12. The method of claim 10, further comprising:
isolating a part of each of the single crystal grain silicon strips located on the trench from the channel.

* * * * *